(12) United States Patent
Hanawa et al.

(10) Patent No.: US 7,972,469 B2
(45) Date of Patent: Jul. 5, 2011

(54) PLASMA PROCESSING APPARATUS

(75) Inventors: Hiroji Hanawa, Sunnyvale, CA (US);
Andrew Nguyen, San Jose, CA (US);
Keiji Horioka, Tokyo (JP); Kallol Bera,
San Jose, CA (US); Kenneth S. Collins,
San Jose, CA (US); Lawrence Wong,
Fremont, CA (US); Martin Jeff Salinas,
San Jose, CA (US); Roger A. Lindley,
Santa Clara, CA (US); Hong S. Yang,
Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1108 days.

(21) Appl. No.: 11/738,505

(22) Filed: Apr. 22, 2007

(65) Prior Publication Data

US 2008/0257261 A1    Oct. 23, 2008

(51) Int. Cl.
H01L 21/00    (2006.01)
(52) U.S. Cl. .................................. 156/345.46
(58) Field of Classification Search ............. 156/345.46; 118/723 MR, 723 MA
See application file for complete search history.

(56) References Cited

U.S. PATENT DOCUMENTS

| | | | |
|---|---|---|---|
| 4,739,169 A | 4/1988 | Kurosawa et al. | |
| 5,772,832 A | 6/1998 | Collins et al. | |
| 6,000,360 A * | 12/1999 | Koshimizu | 118/723 E |
| 6,014,943 A * | 1/2000 | Arami et al. | 118/723 E |
| 6,095,084 A | 8/2000 | Shamouilian et al. | |
| 6,261,428 B1 * | 7/2001 | Nozawa et al. | 204/298.37 |
| 6,333,601 B1 * | 12/2001 | Wickramanayaka | 315/111.41 |
| 6,390,020 B1 | 5/2002 | Hu et al. | |
| 6,432,261 B2 * | 8/2002 | Watanabe et al. | 156/345.47 |
| 6,436,251 B2 | 8/2002 | Gopalraja et al. | |
| 6,562,189 B1 | 5/2003 | Quiles et al. | |
| 6,692,617 B1 | 2/2004 | Fu et al. | |
| 6,758,949 B2 | 7/2004 | Wang et al. | |
| 6,853,141 B2 | 2/2005 | Hoffman et al. | |
| 7,232,767 B2 * | 6/2007 | George et al. | 438/714 |
| 7,294,224 B2 | 11/2007 | Vesci et al. | |
| 7,419,567 B2 * | 9/2008 | Iwasaki et al. | 156/345.46 |
| 2002/0101167 A1 | 8/2002 | Shan et al. | |
| 2002/0130032 A1 | 9/2002 | Ahn et al. | |
| 2003/0226641 A1 * | 12/2003 | Collins et al. | 156/345.49 |
| 2005/0028935 A1 * | 2/2005 | Wickramanayaka et al. | 156/345.34 |

FOREIGN PATENT DOCUMENTS

| | | | |
|---|---|---|---|
| JP | 62196819 A * | 8/1987 | |
| JP | 01230771 A * | 9/1989 | |
| JP | 5226297 | 9/1993 | |
| JP | 2001196358 A * | 7/2001 | |
| JP | 2002313784 A * | 10/2002 | |
| WO | 2006056573 A1 | 6/2006 | |

OTHER PUBLICATIONS

U.S. Office Action dated Dec. 22, 2009 for U.S. Appl. No. 11/738,507.

* cited by examiner

*Primary Examiner* — Ram N Kackar
*Assistant Examiner* — Michelle Crowell
(74) *Attorney, Agent, or Firm* — Alan Taboada; Moser IP Law Group (57) ABSTRACT

Embodiments of the present invention relate to plasma processing apparatus and methods of use thereof. In some embodiments, a plasma control magnet assembly includes a plurality of magnets arranged in a predetermined pattern that generate a magnetic field having a strength greater than 10 Gauss in a region proximate the assembly and less than 10 Gauss in a region remote from the assembly.

23 Claims, 9 Drawing Sheets

FIG. 7

PLASMA PROCESSING APPARATUS

REFERENCE TO RELATED APPLICATIONS

This application is related to U.S. patent application Ser. No 11/738,507 (not yet assigned), filed Apr. 22, 2007 (herewith) by Hanawa, et al., and entitled, "Plasma Processing Method", which is hereby incorporated by reference.

BACKGROUND

1. Field

Embodiments of the present invention generally relate to a plasma processing apparatus and method of use thereof. Specifically, embodiments of the present invention relate to methods and apparatus for controlling a plasma in a plasma enhanced process chamber.

2. Description of the Related Art

Plasma enhanced processes are often used in semiconductor fabrication, for example, to facilitate the etching or deposition of thin films on a substrate. During such processes, a plasma is generally formed from one or more precursor gases within a process chamber containing a substrate to be processed. The creation and control of the plasma (e.g., plasma parameters such as plasma density, ionization, dissociation, uniformity, and/or the like) is a critical parameter in such processes, affecting such variables as processing rates, processing uniformity, feature critical dimensions, feature profiles, and the like. Many processing apparatus and techniques have been utilized to assist in the control of these plasma parameters to improve process rates, device yield, and the like. However, use of such techniques tend to be a trade-off where improvement of one parameter may be obtained, but at the expense of other parameters. As such, even with the use of such techniques, process improvement continues to be desired in order to further improve process throughput, device yields, overall device quality, and the like, without the negative trade-off often associated with such apparatus or techniques.

Thus, there is a need for plasma processing apparatus and methods for improving plasma control.

SUMMARY

Embodiments of the present invention relate to plasma processing apparatus and methods of use thereof. In some embodiments, a plasma control magnet assembly includes a plurality of magnets arranged in a predetermined pattern that generate a magnetic field having a strength greater than 10 Gauss in a region proximate the assembly and less than 10 Gauss in a region remote from the assembly.

In some embodiments, a plasma processing apparatus includes a chamber for processing a substrate and having a processing volume defined therein wherein a plasma is to be formed during operation; a substrate support disposed in the chamber and having a substrate support surface disposed adjacent a lower region of the processing volume; and a magnet assembly including a plurality of magnets arranged in a predetermined pattern that generate a magnetic field having a strength greater than 10 Gauss in an upper region of the processing volume and less than 10 Gauss in the lower region of the processing volume.

BRIEF DESCRIPTION OF DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to semiconductor processing apparatus and methods of use thereof. Specifically, embodiments of the present invention relate to a plasma processing apparatus having a plasma control magnet assembly configured to selectively control portions of a plasma and methods of plasma processing therewith.

Figure 1:
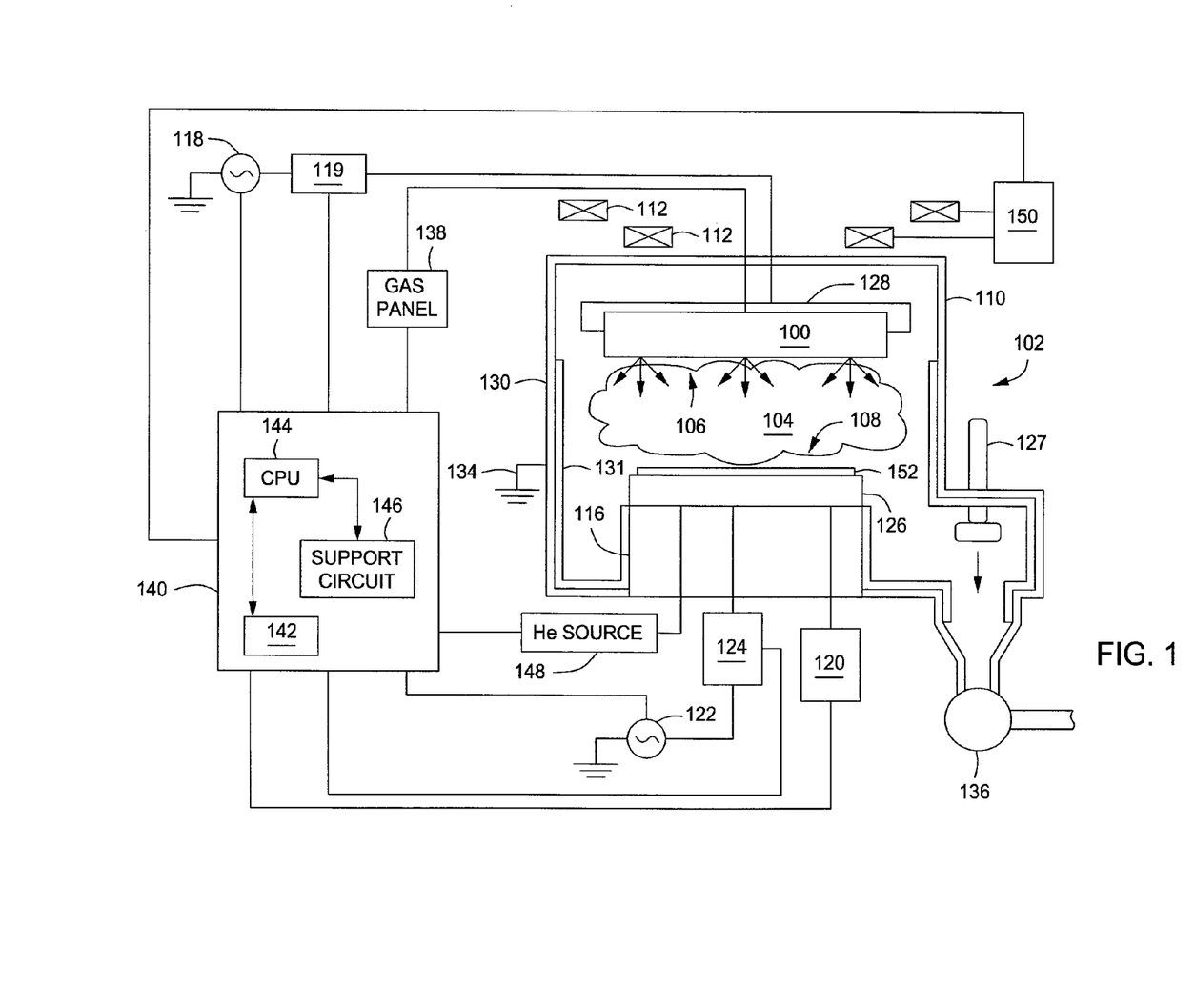
FIG. 1 is a schematic side view of a semiconductor processing apparatus in accordance with some embodiments of the present invention.

The inventive plasma control magnet assembly may be utilized in numerous plasma enhanced processing chambers, such as for example, etch chambers, chemical vapor deposition (CVD) chambers, physical vapor deposition (PVD) chambers, or other chambers configured for plasma processing. One such process chamber suitable for performing the invention is the ENABLER® etch reactor, available from Applied Materials, Inc., of Santa Clara, Calif. This reactor is described in depth in commonly owned U.S. Pat. No. 6,853,141, issued Feb. 8, 2005 to Hoffman, et al., which is herein incorporated by reference in its entirety. As a further non-limiting example, FIG. 1 depicts a schematic, cross-sectional diagram of a dual frequency capacitive plasma source etch reactor 102 suitable for use in performing methods of the present invention. As noted above, it is contemplated that the inventive methods may be performed in other process chambers generally suitable for plasma processing.

As shown in FIG. 1, the reactor 102 generally includes a process chamber 110 having a conductive chamber wall 130. The chamber wall 130 is connected to an electrical ground 134 and may comprise a ceramic liner 131. The ceramic liner 131 facilitates in situ self-cleaning capabilities of the chamber 110, so that byproducts and residues deposited on the ceramic liner 131 can be readily removed from the liner 131 after each substrate has been processed. The process chamber 110 also includes a support pedestal 116 and an upper electrode 128 spaced apart from and opposed to the support pedestal 116. The support pedestal 116 may include an electrostatic chuck 126 for retaining a substrate 152 (also identically referred to herein as a wafer). The electrostatic chuck 126 is controlled by a DC power supply 120.

The support pedestal 116 may be coupled to one or more radio frequency (RF) bias power sources 122 through a matching network 124. The bias power source 122 is generally capable of producing one or more RF signals having a tunable frequency of from about 50 kHz to about 53.56 MHz and a bias power of about 0 to 10,000 Watts. Optionally, the bias power source 122 may be a DC or pulsed DC source. The upper electrode 128 is coupled to an RF source power 118 through an impedance transformer 119 (e.g., a quarter wavelength matching stub). The RF source power 118 is generally capable of producing an RF signal having a tunable frequency of about 160 MHz and a source power of about 0 to 5,000 Watts. The chamber 110 is a high vacuum vessel that is coupled through a throttle valve 127 to a vacuum pump 136.

The reactor 102 may also include one or more coil segments or magnets 112 positioned exterior to the chamber wall 130, near a chamber lid 113. The magnets 112 are controlled by a DC power source or a low-frequency AC power source 150. Although shown positioned above the process chamber 110, it is contemplated that, alternatively or in combination, the magnets 112 may be positioned in other locations, such as around the sides of the process chamber 110. The magnets 112 generally provide a global magnetic field to facilitate direct influence or control of a plasma 104 at least proximate the support pedestal 116 (and any substrate supported thereon) during operation of the process chamber 100.

A showerhead 100 may be provided within the process chamber 110 and coupled to a gas panel 138 for controlling introduction of various gases into the chamber 110 for forming the plasma 104 therefrom during operation. The showerhead 100 may be mounted to the upper electrode 128, as shown in FIG. 1, or may be at least partially formed of a conductive material and configured as at least part of the upper electrode 128. The showerhead 100 may include different zones such that various gases can be released into the chamber 110 with different volumetric flow rates.

A plasma control magnet assembly (described in detail below with respect to FIGS. 2A-6G) is further provided for selectively controlling characteristics of the plasma 104. In one embodiment, the plasma control magnet assembly is configured to selectively control an upper region 106 of the plasma 104 while not affecting (or being negligible) in a lower region 108 of the plasma proximate the substrate 152. Generally, this may be accomplished by the plasma control magnet assembly providing a magnetic field having a relatively high strength in the upper region 106 of the plasma (e.g., proximate the showerhead 100), and a relatively negligible strength in the lower region 108 of the plasma 104 (e.g., proximate the substrate 152). In some embodiments, the magnetic field may be greater than about 10 Gauss in the upper region 106, and less than or equal to about 10 Gauss in the lower region 108. In one embodiment, the upper region 106 is the region proximate the showerhead 100 where the plasma may be substantially non-uniform. The lower region 108 is the region proximate the substrate 152 where the plasma characteristics may have a direct impact on the substrate during processing (e.g., processing rate uniformity, feature profiles, CD uniformity, and the like).

By providing the local magnetic field near the showerhead surface as described above to manipulate the plasma near the showerhead (but not at the substrate), the plasma may be locally controlled in the upper region 106 to improve plasma uniformity, while allowing for plasma diffusion and chemical diffusion effects to homogenize the plasma sufficiently in the lower region 108 (e.g., proximate the substrate surface) to avoid the detrimental affects that global plasma control typically incurs. Thus, the etch (or other processing) characteristics may be made more uniform at the wafer, thereby advantageously allowing for independent control of etch uniformity on the substrate (e.g., center-vs.-edge uniformity), without adversely affecting other various processing parameters such as, in an etching example, etch rate, etch rate selectivity, etch profile, CD (critical dimension), or the like.

During processing of the substrate 152, gas pressure within the interior of the chamber 110 is controlled using the gas panel 138 and the throttle valve 127, and may be maintained, for example, in a range of about 0.1 to 999 mTorr. The temperature of the chamber wall 130 may be controlled using liquid-containing conduits (not shown) located in and/or around the wall. The temperature of the substrate 152 may be controlled by regulating the temperature of the support pedestal 116 via a cooling plate (not shown) having channels formed therein for flowing a coolant. In addition, a backside gas, such as a helium (He) gas from a Helium source 148, may be provided into channels disposed between the back side of the substrate 152 and surface of the electrostatic chuck 126. The electrostatic chuck 126 may also include a resistive heater (not shown) within the chuck body to heat the chuck 126 to a steady-state temperature during processing. The backside He gas may be used to facilitate uniform heating of the substrate 152. The substrate 152 may be maintained, for example, at a temperature of between about 10 to about 500 degrees Celsius.

A controller 140 including a central processing unit (CPU) 144, a memory 142, and support circuits 146 for the CPU 144 is coupled to the various components of the reactor 102 to facilitate control of the processes of the present invention. The memory 142 can be any computer-readable medium, such as random access memory (RAM), read only memory (ROM), floppy disk, hard disk, or any other form of digital storage, local or remote to the reactor 102 or CPU 144. The support circuits 146 are coupled to the CPU 144 for supporting the CPU in a conventional manner. These circuits include cache, power supplies, clock circuits, input/output circuitry and subsystems, and the like. A software routine or a series of program instructions may be stored in the memory 142 which, when executed by the CPU 144, causes the reactor 102 to perform processes of the present invention.

FIG. 1 only shows one exemplary configuration of various types of plasma reactors that can be used to practice the invention. For example, different numbers and types of source power and bias power can be coupled into the plasma chamber using different coupling mechanisms. Using both the source power and the bias power allows independent global control of plasma density and bias voltage of the substrate with respect to the plasma. In some applications, the source power may not be needed and the plasma may be maintained solely by the bias power. The magnets 112 utilized to enhance the plasma density may be driven with a low frequency (e.g., 0.1-0.5 Hertz) AC current source or a DC source. In other applications, the plasma may be generated in a different chamber from the one in which the substrate is located, and the plasma subsequently guided toward the substrate using techniques known in the art.

Figure 2A:
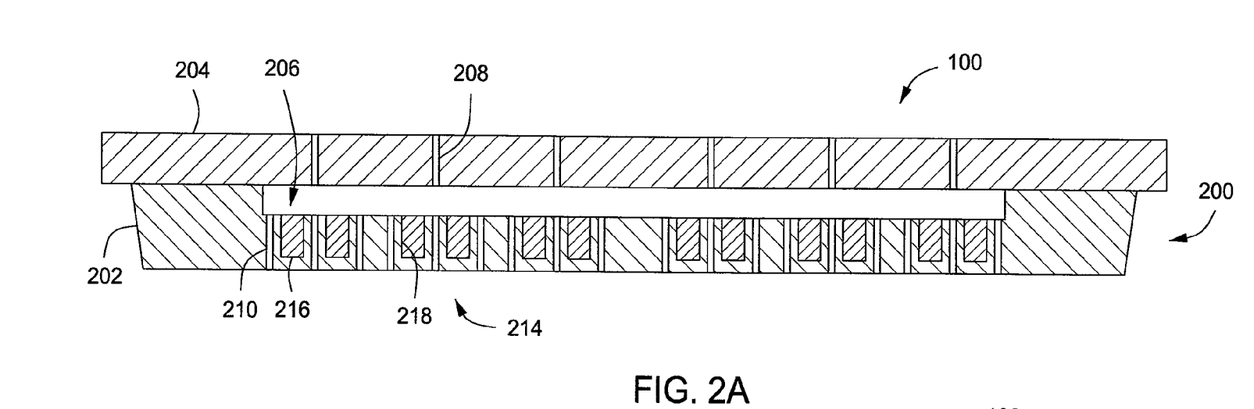
FIGS. 2A-B depict schematic side views, partially in cross-section, of showerheads in accordance with some embodiments of the present invention.
Figure 2B:
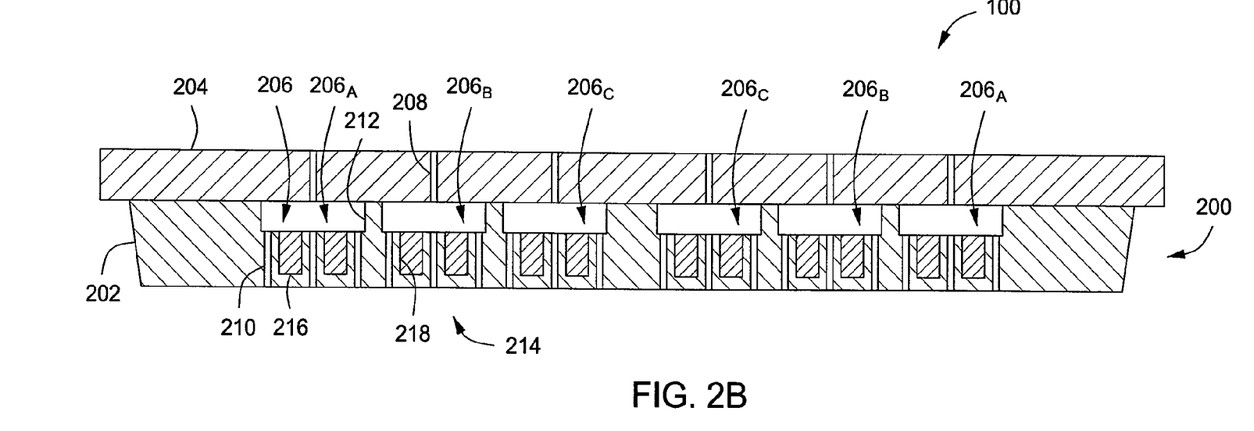

In one embodiment, the plasma control magnet assembly may be provided within the showerhead 100. Alternatively, the plasma control magnet assembly may be disposed external to the showerhead 100 in an upper region of the process chamber 110 or external to the process chamber 110 and configured to provide the desired local control of the plasma 104 as discussed above. FIGS. 2A-B depicts schematic cross-sectional views of illustrative showerheads 100, each having a plasma control magnet assembly 214 in accordance with some embodiments of the present invention. As shown in each of FIGS. 2A-B, the showerhead 100 generally provides a body 200 having a manifold 206 formed therein. The following discussion relates generally to both of FIGS. 2A and 2B, unless specifically noted otherwise. A single manifold 206 may be provided within the showerhead 100, as shown in FIG. 2A. Optionally, a plurality of manifolds 206 may be provided. For example, in the embodiment depicted in FIG. 2B, three annular manifolds, or zones $206_{A-C}$ are depicted. It is contemplated that greater or fewer manifolds 206 may be provided. The manifold 206, or any outer zones thereof, may have an outer diameter that corresponds to the outer diameter of a substrate being processed (e.g., a 200 or 300 mm wafer, or the like). Alternatively, the outer diameter of the manifold 206, or any outer zones thereof, may be larger or smaller than the diameter of the substrate being processed.

In some embodiments, the body 200 may comprise a faceplate 202 and an upper plate 204. The faceplate 202 and/or the upper plate 204 may have one or more recesses formed therein to at least partially define the manifold 206 and may be bolted, clamped, bonded, or otherwise secured together. The mating surfaces of the faceplate 202 and the upper plate 204 may generally have a sufficient flatness such that the surfaces can be bolted without use of o-rings or other sealing mechanisms to sufficiently seal the manifold 206. Alternatively, o-rings or other sealing mechanisms may be provided to prevent gases from escaping from the manifold 206. The faceplate 202 and upper plate 204 assembly are generally fabricated from a non-magnetic material, such as silicon carbide (SiC), however other materials are contemplated.

The upper plate 204 comprises one or more conduits 208 for carrying one or more gases from a gas panel (e.g., gas panel 138 described above with respect to FIG. 1) into the manifold 206. A plurality of apertures, or gas holes, 210 may be provided in a predefined pattern to allow the gases in the manifold 206 to be provided to the process chamber 110 during operation. The gas holes 210 may be provided in any desired size, number, and pattern, for example, to provide a desired quantity of process gases to the process chamber at a desired rate. The distribution of the gas holes 210 need not be uniform across the faceplate 202 and may be arranged in zones or otherwise varying patterns, for example, as a function of the radial distance from the center of the faceplate 202. The relative size, number, and arrangements of the conduits 208 and the gas holes 210 shown in any of the Figures described herein are illustrative only and other configurations are contemplated.

Optionally, and as shown in FIG. 2B, one or more walls 212 may be provided to divide the manifold 206 into independent zones (such as the three zones $206_{A-C}$) to facilitate independent control of gas mixtures, flow rates, or the like provided to corresponding regions of the process chamber 110, thereby facilitating greater control of process results on the substrate. The walls 212 may be at least partially defined by the faceplate 202 or the upper plate 204, or may be a separate element disposed therebetween. Although two annular walls 212 are shown dividing the manifold 206 into three roughly equal-sized zones, greater or fewer walls 212 may be used to form greater or fewer zones. In addition, each zone may be of any size.

In some embodiments, the faceplate 202 may further partially define the plasma control magnet assembly 214. The magnet assembly 214 includes a plurality of magnets 216 configured to provide the desired magnetic field within the process chamber 110 as described above with respect to FIG. 1. In some embodiments, and as shown in FIGS. 2A-B, the plurality of magnets 216 may be disposed within respective openings 218 formed in the faceplate 202. The magnets 216 may be secured within the openings 218 or may be removable therefrom to facilitate alteration of the arrangement of the magnets 216 within the magnet assembly 214. It is contemplated that the plurality of magnets 216 may be disposed elsewhere inside of or external to the showerhead 100 or the process chamber 110 so long as the desired magnetic field is formed within the process chamber 110 as described above (e.g., a strong field proximate the upper region of the plasma and a weak or negligible field proximate the lower region of the plasma).

The magnets 216 may be any suitable magnet for generating a magnetic field. In some embodiments, the magnets 216 may be permanent magnets, such as neodymium iron boron (NdFeB), samarium cobalt (SmCo), alnico, ceramic, ferrite, or the like. In some embodiments, the magnets 216 may be electromagnets. In some embodiments, the magnets 216 may be any combination of the above.

The magnets 216 may generally have any shape size, number, and/or configuration such that they provide the desired magnetic field strength and may be physically located in a desired position (in one example, within the showerhead 100). For example, the magnets 216 may be cylindrical, spherical, ring-shaped, rectangular, square, or the like, or variations thereof. In some embodiments, the magnets 216 may be substantially cylindrical. In some embodiments, the magnets 216 may be cylindrical having diameters ranging from about 0.01 inch to about 1.0 inch. In some embodiments, the magnets 216 have a diameter of about 0.25 inch. In some embodiments, the magnets 216 have a diameter of about 0.375 inch. In some embodiments, the magnets 216 have a diameter of about 0.5 inch. It is understood that other diameters and combinations of the above are suitable for embodiments of the present invention.

The magnets 216 may be provided in any configuration, including a random arrangement, and may be coincident with or independent of any zones formed within the showerhead 100 or other gas delivery system provided to the process chamber 110. In some embodiments, and as depicted in FIGS. 2A-B, the magnets 216 may be are arranged about the gas holes 210 of the faceplate 202. The magnets 216 may further be arranged within any zones defined within the manifold 206 (e.g., zones $206_{A-C}$).

In some embodiments, the magnets 216 may be selectively arranged to control the relative magnetic field strength formed by the magnet assembly 214. For example, one method of maximizing the magnetic field near an array of permanent magnets, while minimizing it farther away, is to alternate the polar orientations of the permanent magnets. For example, in a roughly linear or in an arcuate array of magnets, the orientation of the permanent magnets (using N and S to respectively indicate north and south poles) may be N—S—N—S—N—S. As another example, for two parallel linear or arcuate arrays, one side may be all N while the other side all S. As a third example, for two parallel linear or arcuate arrays they may all alternate as compared to their nearest-neighbor, such that one array is N—S—N-etc. and the second array is S—N—S-etc. It is contemplated that other arrangements of the respective poles of the magnets may be utilized to control the magnetic field strength formed by the magnet assembly 214.

Figure 3:
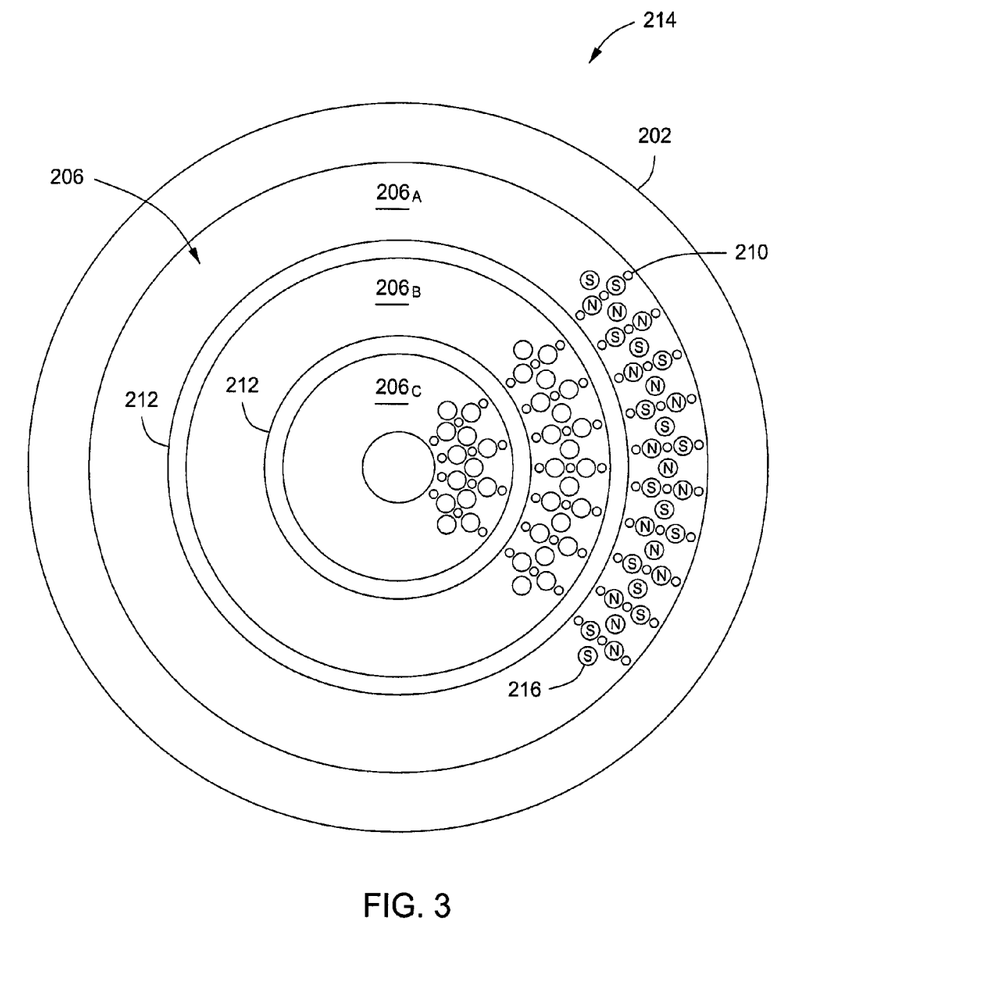
FIG. 3 is a schematic, sectional top view of a showerhead in accordance with some embodiments of the present invention.

For example, FIG. 3 illustratively depicts a top view of the plasma control magnet assembly 214 according to some embodiments of the present invention. As shown in FIG. 3, the plurality of magnets 216 may be arranged to correspond with the zones $206_{A-C}$ of the manifold 206. FIG. 3 further illustratively depicts, in outer zone $206_A$, one of the many possible polar arrangements of the magnets 216. It has been found that different magnetic configurations may be optimal for different plasma processing conditions (such as from chamber-to-chamber, different source and/or bias powers, processing pressures, process chemistry selections, or the like). Therefore, it is contemplated that the selection and arrangement of the magnets 216 and the overall configuration of the plasma control magnet assembly 214 may be varied to provide the desired plasma control and process result. It is contemplated that the size, number, arrangement, or the like of the magnets 216 within the magnet assembly 214, within any zones thereof, or corresponding to any zones thereof, may be the same or different, thereby facilitating greater process control. Alternatively or in combination, the planarity of the plurality of magnets 216 may be selectively varied, such as in zones, to provide the desired magnetic field. For example, at least one magnet on the plurality of magnets 216 may be provided in a different plane as the remaining magnets 216. Thus, by varying the configuration of the magnets 216, processing characteristics, for example, center-vs.-edge on-wafer etch characteristics, can be tuned to be more uniform.

In some embodiments, where the magnets 216 are disposed within a showerhead (for example, in the faceplate 202), the magnets 216 may be arranged to avoid interference with the gas holes 210 in the faceplate 202. It is contemplated that the magnets 216 and the gas holes 210 may be coincident, for example, where the magnets are sufficiently porous, annular, or otherwise allow sufficient gas flow through or past the magnets 216.

Figure 4A:
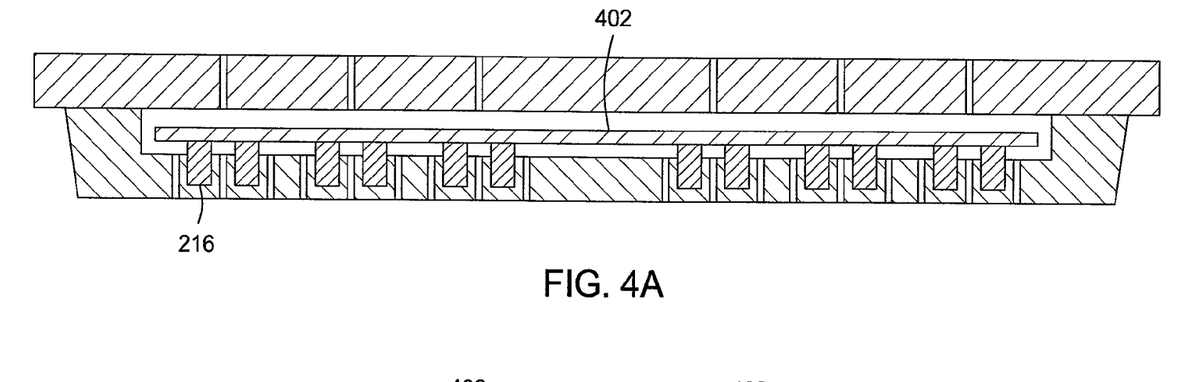
FIGS. 4A-B depict schematic side views of magnet assemblies in accordance with some embodiments of the present invention.
Figure 4B:
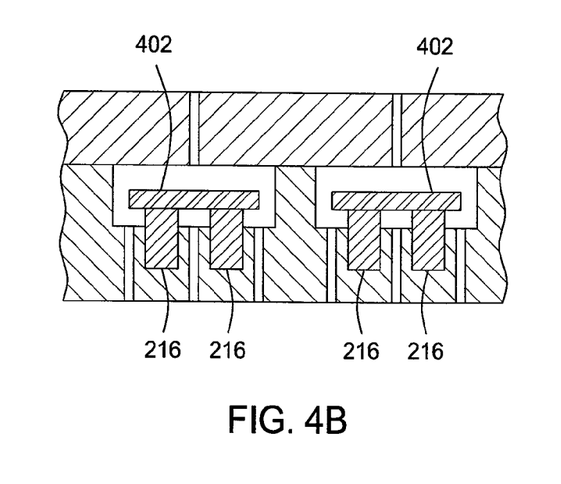

Optionally, and as depicted in FIGS. 4A-B, at least a subset of the magnets 216 may be coupled together by one or more supports 402. The support 402 may provide at least one of many advantages. For example, the support 402 may facilitate ease of fabrication of the magnet assembly 214, control over the position of the magnets 216, ease of insertion and/or removal of the magnets 216 from, for example, openings 218 formed in the faceplate 202 of the showerhead 100 or elsewhere, combinations thereof, or the like. The support 402 may generally be any shape and may support all of the magnets 216, all magnets 216 within a respective zone, a subset of magnets 216 within a zone, or the like. For example, in some embodiments, as shown in FIG. 4A, the support 402 may comprise a single plate or member coupled to each of the magnets 216. Alternatively, as shown in FIG. 4B, annular supports 402 may be respectively coupled to each of the magnets 216 in each zone. It is contemplated that other variations are possible within the teachings of the present invention.

The support 402 may be made of any material. However, in some embodiments, the support 402 may be at least partially fabricated from a magnetic material, thereby increasing the preference for the magnetic flux lines from opposing poles of the magnets 216 to pass through the support 402 and thereby reducing the magnetic field strength due to the magnets 216 at points distant from the magnet assembly 402. In some embodiments, the support 402 may be made from a magnetic material or from an alloy containing one or more metallic materials. In some embodiments, the magnetic material may be steel, and in some non-limiting examples, may be steel 1008, steel 1010, steel A36, steel 416, or the like. In some embodiments, the magnetic material may be a nickel-iron alloy having a very high magnetic permeability, such as MUMETAL®, a 75% nickel, 15% iron, plus copper and molybdenum alloy available from Magnetic Shield Corporation of Bensenville, Ill.

Figure 5:
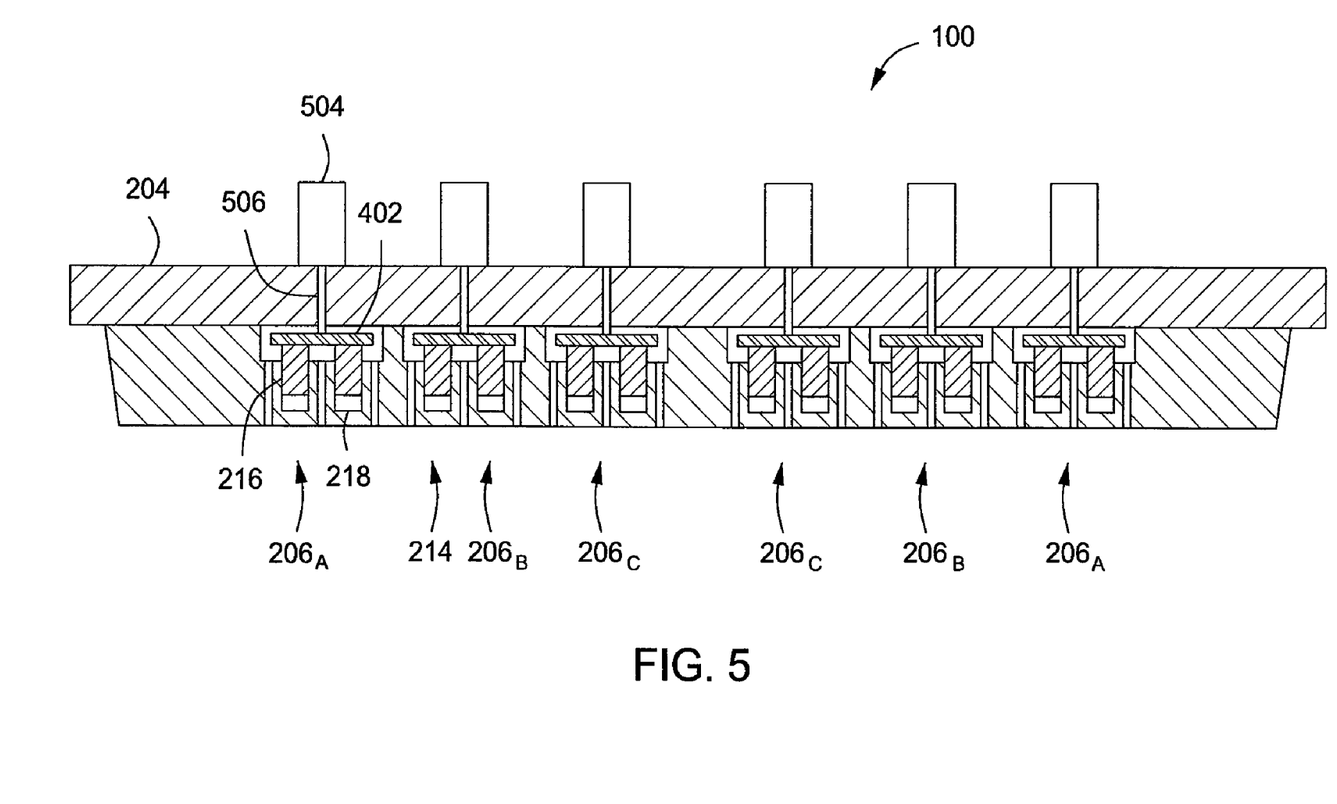
FIG. 5 is a schematic side view, partially in cross-section, of a showerhead in accordance with some embodiments of the present invention.

Optionally, the position of one or more of the magnets 216 in the magnet assembly 214 may be vertically and/or radially controlled. The position of the magnets 216 may be controlled as an entirety, by zones, or individually. For example, FIG. 5 depicts a schematic side view, partially in cross-section, of the showerhead 100 having a plasma control magnet assembly 214 that further comprises a vertical positioning capability in accordance with some embodiments of the present invention. One or more actuators 504 may be coupled to each individual magnet 216. Alternatively, and as shown in FIG. 5, a plurality of actuators 504 may be coupled to defined subsets of magnets 216 (such as zones $206_{A-C}$) via respective supports 402.

The actuators 504 may be disposed in any location suitable for control of the position of the magnets 216. In the embodiment depicted in FIG. 5, the actuators 504 are disposed above the upper plate 204 of the showerhead 100 and are coupled to the magnets 216 via a shaft 506 coupled to the support 402. The plurality of magnets 216 may thus be vertically positioned as a unit, in respective zones, and individually or as subsets within zones. Alternatively or in combination, actuators (not shown) may provide for rotation of the magnet assembly 214, or independent zones thereof.

Alternatively or in combination with the magnet positioning described above with respect to FIG. 5, the magnet assembly 214 may further comprise magnetic shields to further control the magnetic field strength and configuration within the process chamber 110. The magnetic shields comprise a magnetic material, such as any of the magnetic materials discussed above with respect to the support 402, suitable for selectively providing a preferential path for the magnetic flux lines to travel therethrough, thereby reducing the magnetic field strength at desired locations remote from the shields (such as in the lower region of the plasma proximate the substrate). The shields may be disposed adjacent to an entire perimeter of the magnets 216, a partial perimeter of the magnets, and/or on either or both sides of the magnets 216 within a respective zone.

For example, FIGS. 6A-G depict schematic cross-sectional views of magnetic shield assemblies in accordance with some embodiments of the present invention. Although each of the following embodiments depict positionable magnetic shields, it is contemplated that the magnetic shields may be stationary and need not include any actuation mechanisms or capabilities. In addition, the following depictions are not intended to limiting as to the geometry of the shields (which may vary from that shown) or their range of movement (which may extend from at least partially overlapping to completely overlapping the magnets).

Figure 6A:
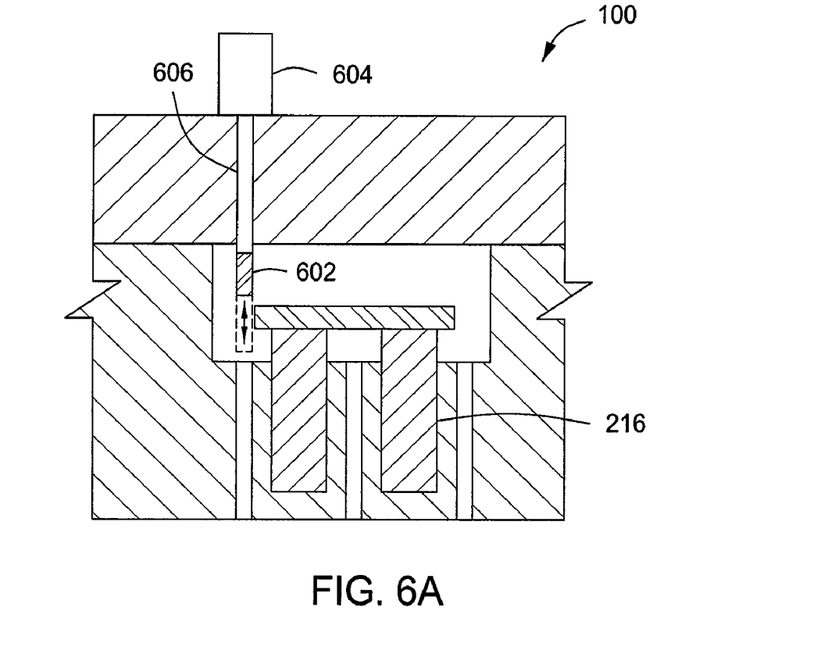
FIGS. 6A-6G are schematic cross-sectional views of magnetic shield assemblies in accordance with some embodiments of the present invention.

FIG. 6A depicts a magnetic shield 602, such as an annular ring of magnetic material disposed around an array of magnets 216. The shield 602 may be coupled to an actuator 604 via a shaft 606. The actuator 604 may selectively position the shield 602 at points between an upper position (as shown) and a lower position (shown in phantom). In the upper position, the shield has little or no effect on the flux lines flowing between opposing poles of the magnets 216. However, as increasingly more surface area of the shield 602 overlaps with the magnets more flux lines will preferentially flow through the shield 602. Thus, by controlling the quantity of flux lines traveling through the shield 602, as opposed to the interior of the chamber 110, the impact of the magnetic field created by the magnets 216 proximate the upper and lower regions of the plasma within the chamber 110 may be selectively controlled.

Figure 6B:
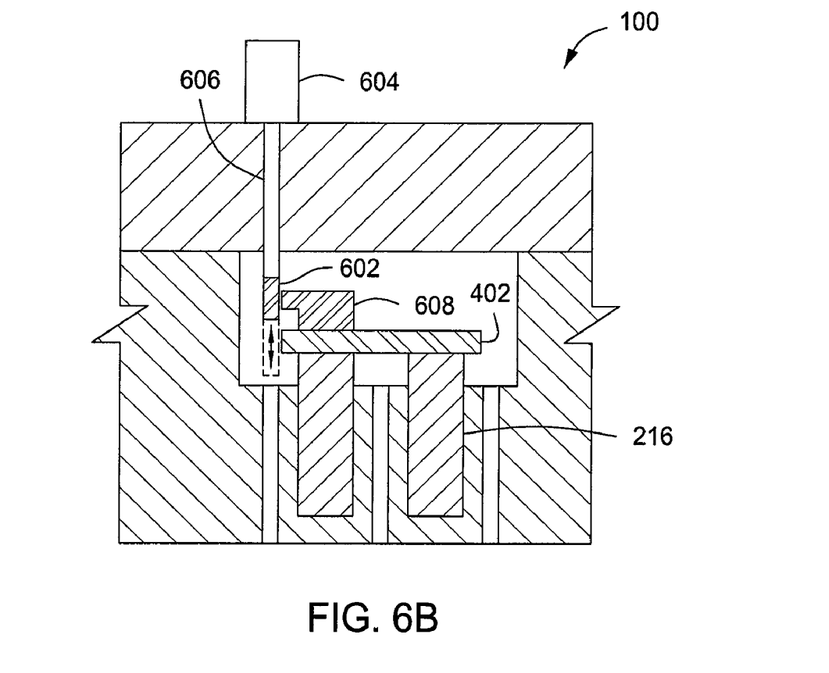

FIG. 6B depicts a variation of FIG. 6A, where an added stationary shield 608 is affixed on the magnet support 402. The added stationary shield 608 increases the desirability for the magnetic flux lines to pass through the shields, and provides greater capacity for magnetic flux flow (e.g., to avoid saturation of the shields 608, 602) thereby further increasing the ability to regulate the strength of the magnetic field within the process chamber 110.

Figure 6C:
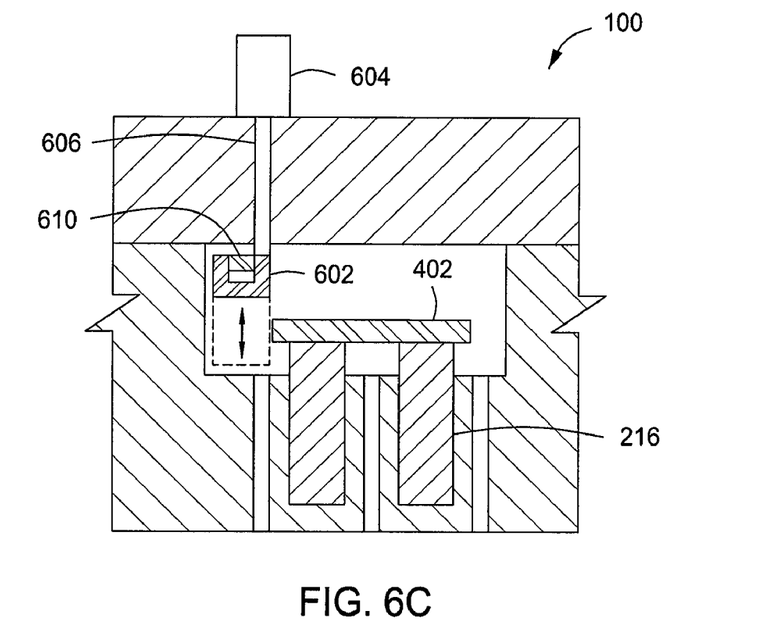

A magnetic material (e.g., a shield piece) exposed to a small amount of magnetic flux may respond well to that external magnetic field (e.g., the flux has gone only a small way up the hysteresis curve). However, if the magnetic shield piece is very close to the permanent magnetic, then the shield may become saturated (e.g., the flux has gone far up the hysteresis curve, thereby diminishing the effect of the magnetic shield piece). To overcome this limitation, the shield can be primed by forming an opposing magnetic field inside of it, thereby putting the shield on the negative side of the hysteresis curve. For example, FIG. 6C depicts a u-shaped, or three-sided annular magnetic shield 602 disposed around an array of magnets 216. A magnet 610 is disposed in open channel of the shield 602. The magnet 610 should be positioned in the shield 602 such that the flux direction of the magnet 610 is opposite the direction of the flux lines nearest the shield 602 from the magnets 216, thereby placing the shield 602 on the negative side of the hysteresis curve with respect to the plurality of magnets 216. The shield 602 may be coupled to an actuator 604 via a shaft 606. The actuator 604 may selectively position the shield 602 at points between an upper position (as shown) and a lower position (shown in phantom). In the upper position, the shield has little or no effect on the flux lines flowing between opposing poles of the magnets 216. However, as increasingly more surface area of the shield 602 overlaps with the magnets more flux lines will preferentially flow through the shield 602. As the shield 602 begins on the negative side of the hysteresis curve, a greater quantity of flux lines may travel through the shield, thereby facilitating control of the magnetic field strength proximate the upper and lower regions of the plasma.

Figure 6D:
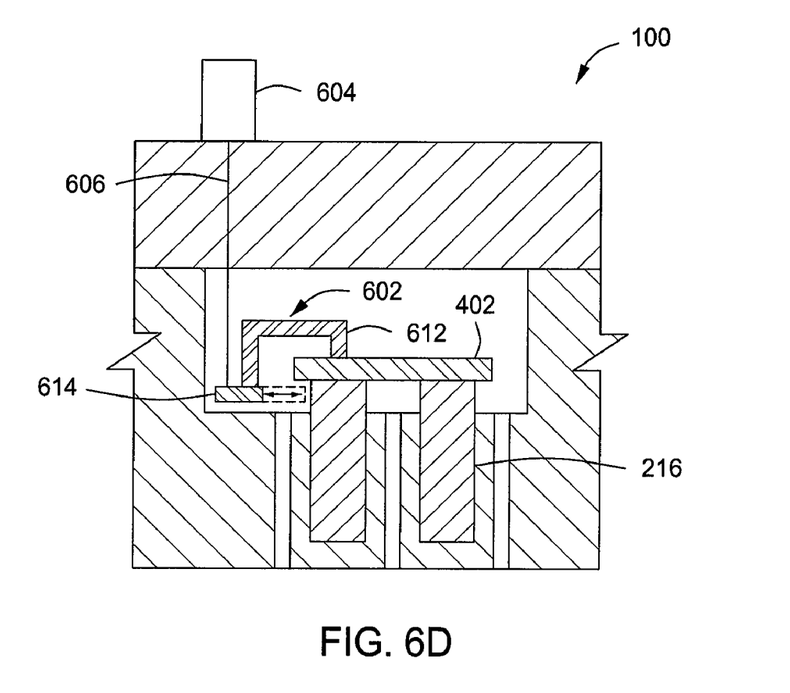

FIG. 6D depicts a magnetic shield 602 disposed around an array of magnets 216. The shield 602 comprises a stationary piece 612 coupled to the magnet support 402, and a radially actuated piece 614. The radially actuated piece 614 may be coupled to an actuator 604 via a shaft 606. The actuator 604 may control the position of the radially actuated piece 614 closer or farther from the magnets 216, utilizing an iris-style mechanism.

Figure 6E:
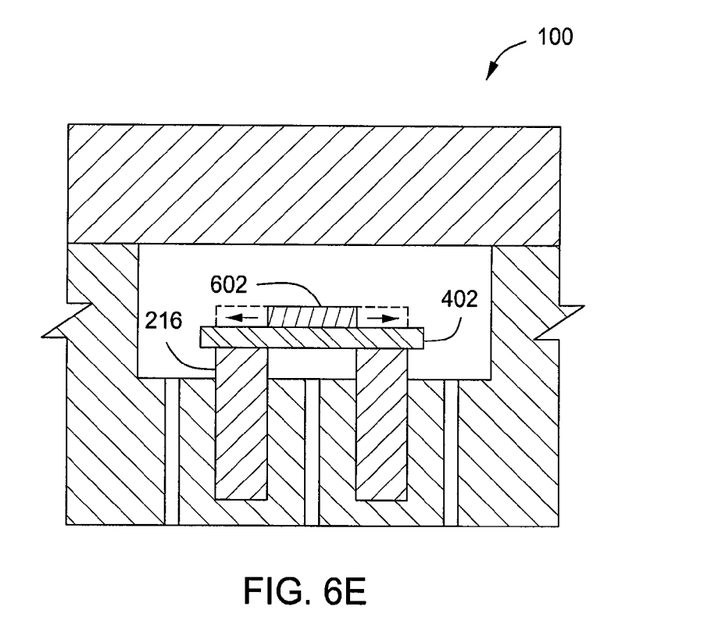

FIG. 6E depicts a magnetic shield 602 disposed above the magnet support 402. The shield 602 typically comprises an arc of material (i.e., not a complete annular ring) disposed above regions of the magnet support 402 where magnetic flux saturation may be high, thereby increasing the flux capacity between the magnets passing through the support 402 and the shield 602. The shield 602 may be radially movable to selectively control the quantity of flux lines that may travel through the shield 602, thereby facilitating control of the magnetic field strength proximate the upper and lower regions of the plasma. The shield 602 may comprise an iris-like mechanism to facilitate radial movement of the shield 602. Alternatively, the shield 602 may comprise a plurality of segments configured to facilitate independent radial movement of the segments of the shield 602.

Figure 6F:
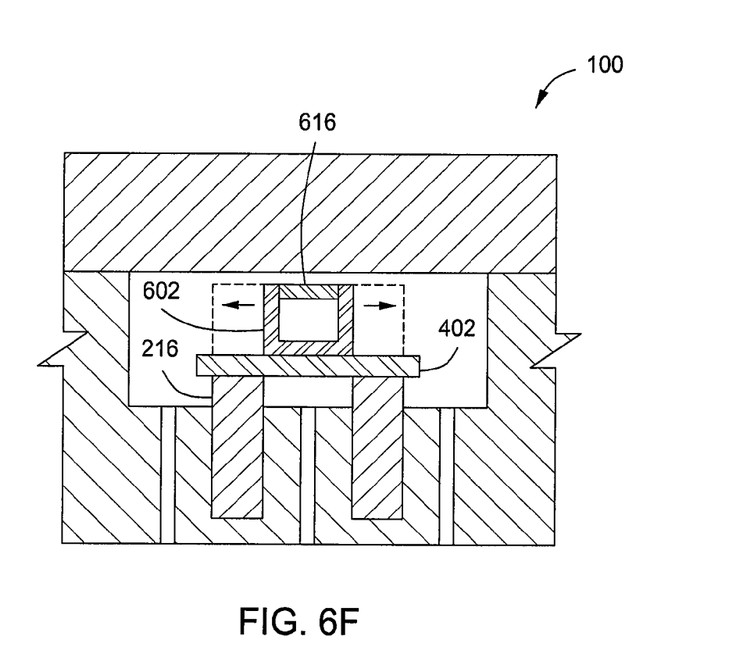

FIG. 6F depicts a variation of FIG. 6E wherein the shield 602 comprises a unshaped, or three-sided magnetic shield 602 disposed around an array of magnets 216. A magnet 616 is disposed in open channel of the shield 602. The magnet 616 should be positioned in the shield 602 such that the flux direction of the magnet 616 is opposite the direction of the flux lines nearest the shield 602 from the magnets 216, thereby placing the shield 602 on the negative side of the hysteresis curve with respect to the plurality of magnets 216, similar to the discussion above with respect to FIG. 6C. The shield 602 may be radially movable to selectively control the quantity of flux lines that may travel through the shield 602, thereby facilitating control of the magnetic field strength proximate the upper and lower regions of the plasma. The shield 602 may comprise an iris-like mechanism to facilitate radial movement of the shield 602. Alternatively, the shield 602 may comprise a plurality of segments configured to facilitate independent radial movement of the segments of the shield 602.

Figure 6G:
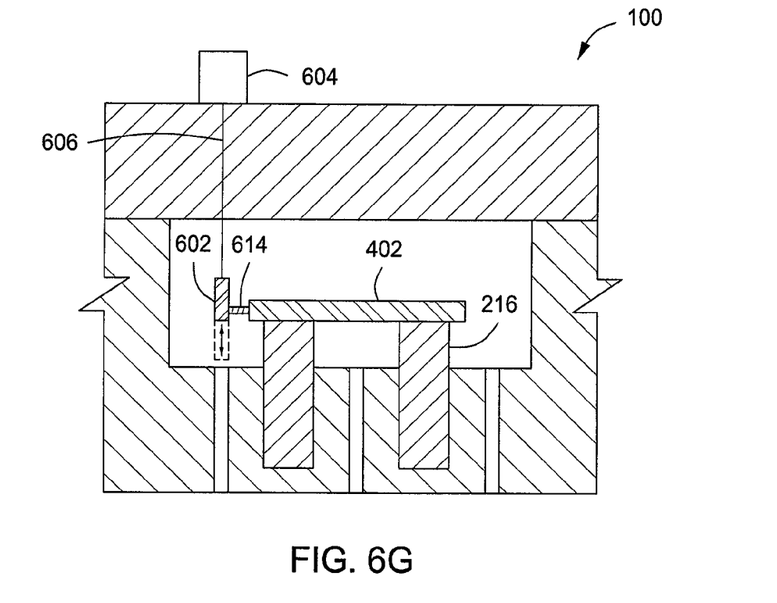

FIG. 6G depicts a shield 602 rotatably affixed to the magnet support 402 via a hinge 614 or other attachment mechanisms. The shield 602 may be coupled to an actuator 604 via a shaft 606. The actuator 604 controls the quantity of shield material adjacent to the magnets 216, thereby selectively controlling the quantity of flux lines preferentially traveling therethrough. Thus, by passing more flux lines through the shield 602, as opposed to the interior of the chamber 110, the magnets 216 have less impact on the plasma created within the chamber 110, thereby facilitating control of the magnetic field strength proximate the upper and lower regions of the plasma.

Figure 7:
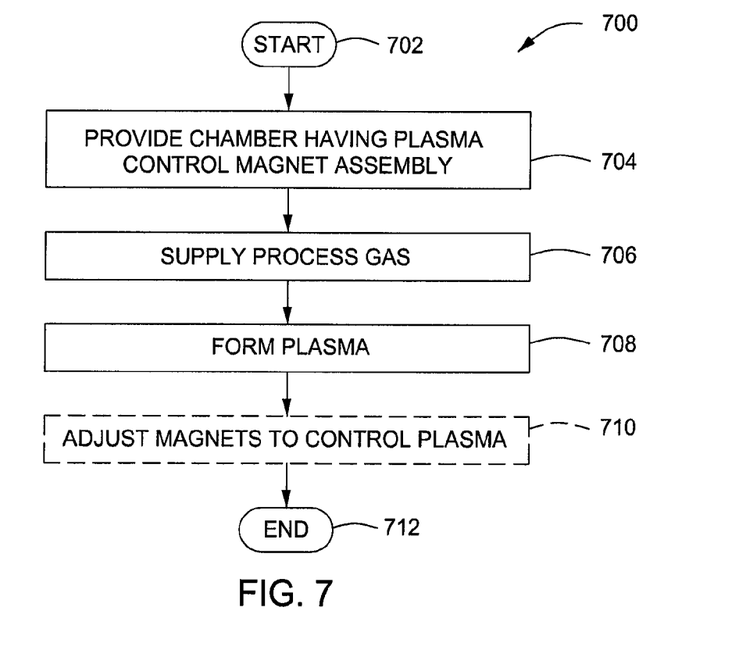
FIG. 7 is a flowchart of a method of plasma processing in accordance with some embodiments of the present invention.

FIG. 7 depicts a flowchart of a method 700 of controlling a plasma in accordance with some embodiments of the present invention. The method begins at 702. At 704, a process chamber having a plasma control magnet assembly in accordance with embodiments of the present invention, is provided. In some embodiments, the plasma control magnet assembly may be part of a showerhead disposed in the process chamber, such as described above. In other embodiments, the plasma control magnet assembly may be disposed externally to the showerhead and configured to produce a desired magnetic field to the plasma.

Next, at 706, a process gas or gas mixture is supplied to the process chamber as desired for a particular process, such as etching or depositing a desired material on a substrate.

Next, at 708, a plasma is formed from the process gas. In one embodiment, the plasma is a high density plasma, e.g., having a density greater than or equal to about $5 \times 10^{10}$ ions/$cm^3$. The plasma may be formed in any suitable manner, such as by coupling RF power to the process gas to dissociate and ionize the process gas. In some embodiments, between about 30-10,000 Watts of RF power may be provided at a frequency of between about 400 kHz-200 Mhz. For example, in some embodiments, about 4,000 Watts of RF bias power is supplied at a frequency of about 1.8 Mhz, about 1,500 Watts of RF bias power is supplied at a frequency of about 13.56 Mhz, and about 1,00 Watts of RF source power is supplied at a frequency of about 60 Mhz.

As discussed above, the magnetic field created by the magnet assembly 214 is substantially constrained to an upper region of the plasma such that a region proximate the substrate has a magnetic field less than about 10 Gauss due to the magnet assembly 214. Thus, the plasma will advantageously be affected by the magnetic field proximate an upper region of the plasma (such as proximate the showerhead), thereby improving plasma characteristics such as plasma density and/or uniformity. Further, the plasma advantageously is not directly affected by the magnetic field created by the magnet assembly proximate a lower region of the plasma. Thus, plasma characteristics may be improved without the accompanying negative on-wafer affects typically seen in other prior art plasma control techniques.

At 710, the characteristics of the plasma may optionally by further controlled by adjusting and/or regulating the magnetic field generated from the plasma control magnet assembly. For example, the magnetic field may be adjusted or regulated via actuating the magnets 216, for example, in a vertical direction. Alternatively or in combination, one or more shields 602 may be provided as discussed above to alter the magnetic flux lines of the magnets 216. Upon reaching a desired endpoint for the process, the method 700 ends at 712.

Thus, plasma processing apparatus having a plasma control magnet assembly configured to selectively control portions of a plasma and methods of plasma processing therewith have been provided herein. The inventive apparatus and methods advantageously provide for control of plasma characteristics such as plasma uniformity and density without adversely affecting on-wafer process results.

It is contemplated that the described features of any embodiments described herein may be used in conjunction with any feature of any other embodiments to the extent not inconsistent or expressly disclosed otherwise. While the foregoing is directed to some embodiments of the present invention, other and further embodiments of the invention may be devised without departing from the basic scope thereof, and the scope thereof is determined by the claims that follow.

We claim:

1. A plasma control magnet assembly, comprising:
   a plurality of magnets arranged in a predetermined pattern that generate a magnetic field in a plasma enhanced processing chamber for processing a substrate disposed therein, the magnetic field having a strength greater than 10 Gauss in a region proximate the assembly, corresponding to a processing region within the chamber that is remote from the substrate, and less than 10 Gauss in a region remote from the assembly, corresponding to a processing region within the chamber that is near the substrate; a showerhead for providing one or more process gases to a process chamber, wherein the plurality of magnets are disposed within the showerhead;
   one or more shields comprising a magnetic material disposed proximate the plurality of magnets to reduce the quantity of magnetic flux lines at regions remote from the shield; and
   one or more actuators coupled to the shields to control the position of the shields relative to the plurality of magnets.

2. The assembly of claim 1, wherein the plurality of magnets further comprise:
   at least one of a plurality of electromagnets or a plurality of permanent magnets.

3. The assembly of claim 1, wherein the plurality of magnets are permanent magnets comprising at least one of neodymium iron boron (NdFeB), samarium cobalt (SmCo), alnico, ceramic or ferrite permanent magnets.

4. The assembly of claim 3, wherein the permanent magnets are substantially cylindrical and have a diameter between about 0.01 inch to about 1.0 inch.

5. The assembly of claim 1, wherein the plurality of magnets are arranged in a plurality of zones.

6. The assembly of claim 5, wherein the plurality of zones are concentric and each contain a plurality of magnets.

7. The assembly of claim 1, wherein at least some of the plurality of magnets are coupled to a support disposed over the plurality of magnets.

8. The assembly of claim 7, wherein the support comprises a magnetic material.

9. The assembly of claim 8, wherein the one or more shields are disposed proximate the support.

10. The assembly of claim 9, wherein the shield circumscribes at least a subset of the plurality of magnets.

11. The assembly of claim 7, wherein the plurality of magnets are coupled to a plurality of supports arranged in a plurality of zones.

12. The assembly of claim 1, wherein at least one of the plurality of magnets is disposed in a different plane than the remaining magnets of the plurality of magnets.

13. The assembly of claim 1, further comprising:
    at least one actuator coupled to at least one of the plurality of magnets for controlling the vertical position of the magnets to which the actuator is coupled.

14. A plasma processing apparatus, comprising:
    a chamber for processing a substrate and having a processing volume defined therein wherein a plasma is to be formed during operation;
    a substrate support disposed in the chamber and having a substrate support surface disposed adjacent a lower region of the processing volume; and
    a magnet assembly comprising:
      a plurality of magnets arranged in a predetermined pattern that generate a magnetic field having a strength greater than 10 Gauss in an upper region of the processing volume and less than 10 Gauss in the lower region of the processing volume; a showerhead for providing one or more process gases to a process chamber, wherein the plurality of magnets are disposed within the showerhead;
      one or more shields comprising a magnetic material disposed proximate the plurality of magnets to reduce the quantity of magnetic flux lines at regions remote from the shield; and
      one or more actuators coupled to the shields to control the position of the shields relative to the plurality of magnets.

15. The apparatus of claim 14, wherein the plurality of magnets further comprise at least one of a plurality of electromagnets or a plurality of permanent magnets.

16. The apparatus of claim 15, wherein the plurality of magnets are permanent magnets comprising at least one of neodymium iron boron (NdFeB), samarium cobalt (SmCo), alnico, ceramic or ferrite.

17. The apparatus of claim 14, wherein the plurality of magnets are arranged in a plurality of zones.

18. The apparatus of claim 14, wherein at least some of the plurality of magnets are coupled to a support disposed over the plurality of magnets.

19. The apparatus of claim 18, wherein the support comprises a magnetic material.

20. The apparatus of claim 19, wherein the one or more shields are disposed proximate the support.

21. The apparatus of claim 18, wherein the plurality of magnets are coupled to a plurality of supports arranged in a plurality of zones.

22. The apparatus of claim 14, wherein at least one of the plurality of magnets is disposed in a different plane than the remaining magnets of the plurality of magnets.

23. The apparatus of claim 14, further comprising:
    one or more actuators coupled to at least one of the plurality of magnets, wherein the actuators control the vertical position of the magnets to which they are coupled.

* * * * *